(12) United States Patent
Huang et al.

(10) Patent No.: US 7,867,860 B2
(45) Date of Patent: Jan. 11, 2011

(54) STRAINED CHANNEL TRANSISTOR FORMATION

(75) Inventors: Yi-Chun Huang, Pingjhen (TW);
Yen-Ping Wang, Taipei (TW);
Chih-Hsin Ko, Fongshan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 813 days.

(21) Appl. No.: 10/897,563

(22) Filed: Jul. 23, 2004

(65) Prior Publication Data

US 2005/0082522 A1    Apr. 21, 2005

Related U.S. Application Data

(60) Provisional application No. 60/490,425, filed on Jul. 25, 2003.

(51) Int. Cl.
*H01L 21/336* (2006.01)

(52) U.S. Cl. .............. 438/285; 438/303; 438/305; 438/514; 438/530; 438/671; 438/683; 438/700; 438/938

(58) Field of Classification Search .......... 438/197, 438/303, 305, 306, 514, 530, 551, 671, 683, 438/700, 938, 942, FOR. 191, 285
See application file for complete search history.

(56) References Cited

U.S. PATENT DOCUMENTS

| | | | |
|---|---|---|---|
| 4,069,094 A | 1/1978 | Shaw et al. | |
| 4,314,269 A | 2/1982 | Fujiki | |
| 4,497,683 A | 2/1985 | Celler et al. | |
| 4,631,803 A | 12/1986 | Hunter et al. | |
| 4,892,614 A * | 1/1990 | Chapman et al. | ............. 438/425 |
| 4,946,799 A | 8/1990 | Blake et al. | |
| 4,952,993 A * | 8/1990 | Okumura | .................... 257/388 |
| 5,130,773 A | 7/1992 | Tsukada | |
| 5,155,571 A | 10/1992 | Wang et al. | |

(Continued)

FOREIGN PATENT DOCUMENTS

| | | | |
|---|---|---|---|
| EP | 0 683 522 A2 | 11/1995 | |
| EP | 0 828 296 A2 | 3/1998 | |
| WO | WO 03/017336 A2 | 2/2003 | |

OTHER PUBLICATIONS

"Future Gate Stack," International Sematech, 2001 Annual Report.
Blaauw, D., et al., "Gate Oxide and Subthreshold Leakage Characterization, Analysis and Optimization," date unknown.

(Continued)

*Primary Examiner*—Zandra Smith
*Assistant Examiner*—Joannie A Garcia
(74) *Attorney, Agent, or Firm*—Slater & Matsil, L.L.P.

(57) ABSTRACT

A strained channel transistor is provided. The strained channel transistor comprises a substrate formed of a first material. A source region comprised of a second material is formed in a first recess in the substrate, and a drain region comprised of the second material is formed in a second recess in the substrate. A strained channel region formed of the first material is intermediate the source and drain region. A gate stack formed over the channel region includes a gate electrode overlying a gate dielectric. A gate spacer formed along a sidewall of the gate electrode overlies a portion of at least one of said source region and said drain region. A cap layer may be formed over the second material, and the source and drain regions may be silicided.

21 Claims, 5 Drawing Sheets

U.S. PATENT DOCUMENTS

| | | | |
|---|---|---|---|
| 5,273,915 A | 12/1993 | Hwang et al. | |
| 5,338,960 A | 8/1994 | Beasom | |
| 5,378,919 A | 1/1995 | Ochiai | |
| 5,447,884 A | 9/1995 | Fahey et al. | |
| 5,461,250 A | 10/1995 | Burghartz et al. | |
| 5,479,033 A | 12/1995 | Baca et al. | |
| 5,525,828 A | 6/1996 | Bassous et al. | |
| 5,534,713 A | 7/1996 | Ismail et al. | |
| 5,596,529 A | 1/1997 | Noda et al. | |
| 5,607,865 A | 3/1997 | Choi et al. | |
| 5,629,544 A | 5/1997 | Voldman et al. | |
| 5,656,524 A | 8/1997 | Eklund et al. | |
| 5,708,288 A | 1/1998 | Quigley et al. | |
| 5,714,777 A | 2/1998 | Ismail et al. | |
| 5,763,315 A | 6/1998 | Benedict et al. | |
| 5,770,881 A | 6/1998 | Pelella et al. | |
| 5,789,807 A | 8/1998 | Correale, Jr. | |
| 5,811,857 A | 9/1998 | Assaderaghi et al. | |
| 5,955,766 A | 9/1999 | Ibi et al. | |
| 5,965,917 A | 10/1999 | Maszara et al. | |
| 5,972,722 A | 10/1999 | Visokay et al. | |
| 6,008,095 A | 12/1999 | Gardner et al. | |
| 6,015,990 A | 1/2000 | Hieda et al. | |
| 6,015,993 A | 1/2000 | Voldman et al. | |
| 6,027,988 A | 2/2000 | Cheung et al. | |
| 6,040,991 A | 3/2000 | Ellis-Monaghan et al. | |
| 6,046,487 A | 4/2000 | Benedict et al. | |
| 6,059,895 A | 5/2000 | Chu et al. | |
| 6,061,267 A | 5/2000 | Houston | |
| 6,096,591 A | 8/2000 | Gardner et al. | |
| 6,100,153 A | 8/2000 | Nowak et al. | |
| 6,100,204 A | 8/2000 | Gardner et al. | |
| 6,103,599 A | 8/2000 | Henley et al. | |
| 6,107,125 A | 8/2000 | Jaso et al. | |
| 6,111,267 A | 8/2000 | Fischer et al. | |
| 6,190,996 B1 | 2/2001 | Mouli et al. | |
| 6,198,173 B1 | 3/2001 | Huang | |
| 6,222,234 B1 | 4/2001 | Imai | |
| 6,232,163 B1 | 5/2001 | Voldman et al. | |
| 6,256,239 B1 | 7/2001 | Akita et al. | |
| 6,258,664 B1 | 7/2001 | Reinberg | |
| 6,281,059 B1 | 8/2001 | Chang et al. | |
| 6,291,321 B1 | 9/2001 | Fitzgerald | |
| 6,294,834 B1 | 9/2001 | Yeh et al. | |
| 6,303,479 B1 | 10/2001 | Snyder | |
| 6,339,232 B1 | 1/2002 | Takagi | |
| 6,341,083 B1 | 1/2002 | Wong | |
| 6,342,410 B1 | 1/2002 | Yu | |
| 6,358,791 B1 | 3/2002 | Hsu et al. | |
| 6,387,739 B1 | 5/2002 | Smith, III | |
| 6,407,406 B1 | 6/2002 | Tezuka | |
| 6,413,802 B1 | 7/2002 | Hu et al. | |
| 6,414,355 B1 | 7/2002 | An et al. | |
| 6,420,218 B1 | 7/2002 | Yu | |
| 6,429,061 B1 | 8/2002 | Rim | |
| 6,433,382 B1 | 8/2002 | Orlowski et al. | |
| 6,448,114 B1 | 9/2002 | An et al. | |
| 6,448,613 B1 | 9/2002 | Yu | |
| 6,475,838 B1 | 11/2002 | Bryant et al. | |
| 6,475,869 B1 | 11/2002 | Yu | |
| 6,489,215 B2 | 12/2002 | Mouli et al. | |
| 6,489,664 B2 | 12/2002 | Re et al. | |
| 6,489,684 B1 | 12/2002 | Chen et al. | |
| 6,495,900 B1 | 12/2002 | Mouli et al. | |
| 6,498,359 B2 * | 12/2002 | Schmidt et al. | 257/190 |
| 6,518,610 B2 | 2/2003 | Yang et al. | |
| 6,521,952 B1 | 2/2003 | Ker et al. | |
| 6,524,905 B2 | 2/2003 | Yamamichi et al. | |
| 6,525,403 B2 | 2/2003 | Inaba et al. | |
| 6,531,741 B1 | 3/2003 | Hargrove et al. | |
| 6,541,343 B1 * | 4/2003 | Murthy et al. | 438/299 |
| 6,549,450 B1 | 4/2003 | Hsu et al. | |
| 6,555,839 B2 | 4/2003 | Fitzgerald | |
| 6,558,998 B2 | 5/2003 | Belleville et al. | |
| 6,573,172 B1 | 6/2003 | En et al. | |
| 6,576,526 B2 | 6/2003 | Kai et al. | |
| 6,586,311 B2 | 7/2003 | Wu | |
| 6,600,170 B1 | 7/2003 | Xiang | |
| 6,605,514 B1 | 8/2003 | Tabery et al. | |
| 6,611,029 B1 | 8/2003 | Ahmed et al. | |
| 6,617,643 B1 | 9/2003 | Goodwin-Johansson | |
| 6,621,131 B2 | 9/2003 | Murthy et al. | |
| 6,633,070 B2 | 10/2003 | Miura et al. | |
| 6,635,909 B2 | 10/2003 | Clark et al. | |
| 6,642,090 B1 | 11/2003 | Fried et al. | |
| 6,653,700 B2 | 11/2003 | Chau et al. | |
| 6,657,259 B2 | 12/2003 | Fried et al. | |
| 6,657,276 B1 | 12/2003 | Karlsson et al. | |
| 6,674,100 B2 | 1/2004 | Kubo et al. | |
| 6,686,247 B1 | 2/2004 | Bohr | |
| 6,690,082 B2 | 2/2004 | Lakshmikumar | |
| 6,706,576 B1 | 3/2004 | Ngo et al. | |
| 6,720,619 B1 | 4/2004 | Chen et al. | |
| 6,724,019 B2 | 4/2004 | Oda et al. | |
| 6,737,710 B2 * | 5/2004 | Cheng et al. | 257/382 |
| 6,740,535 B2 | 5/2004 | Singh et al. | |
| 6,759,717 B2 | 7/2004 | Sagarwala et al. | |
| 6,762,448 B1 | 7/2004 | Lin et al. | |
| 6,784,101 B1 | 8/2004 | Yu et al. | |
| 6,794,764 B1 | 9/2004 | Kamal et al. | |
| 6,797,556 B2 | 9/2004 | Murthy et al. | |
| 6,798,021 B2 | 9/2004 | Ipposhi et al. | |
| 6,803,641 B2 | 10/2004 | Papa Rao et al. | |
| 6,812,103 B2 | 11/2004 | Wang et al. | |
| 6,821,840 B2 | 11/2004 | Wieczorek et al. | |
| 6,855,990 B2 | 2/2005 | Yeo et al. | |
| 6,867,101 B1 | 3/2005 | Yu | |
| 6,867,433 B2 | 3/2005 | Yeo et al. | |
| 6,872,610 B1 | 3/2005 | Mansoori et al. | |
| 6,885,084 B2 * | 4/2005 | Murthy et al. | 257/622 |
| 6,891,192 B2 | 5/2005 | Chen et al. | |
| 6,924,181 B2 | 8/2005 | Huang et al. | |
| 6,969,618 B2 | 11/2005 | Mouli | |
| 7,013,447 B2 | 3/2006 | Mathew et al. | |
| 2001/0028089 A1 | 10/2001 | Adan | |
| 2002/0008289 A1 | 1/2002 | Murota et al. | |
| 2002/0031890 A1 | 3/2002 | Watanabe et al. | |
| 2002/0045318 A1 | 4/2002 | Chen et al. | |
| 2002/0074598 A1 | 6/2002 | Doyle et al. | |
| 2002/0076899 A1 | 6/2002 | Skotnicki et al. | |
| 2002/0125471 A1 | 9/2002 | Fitzgerald et al. | |
| 2002/0153549 A1 | 10/2002 | Laibowitz et al. | |
| 2002/0163036 A1 | 11/2002 | Miura et al. | |
| 2002/0190284 A1 | 12/2002 | Murthy et al. | |
| 2003/0001219 A1 | 1/2003 | Chau et al. | |
| 2003/0030091 A1 | 2/2003 | Bulsara et al. | |
| 2003/0072126 A1 | 4/2003 | Bhattacharyya | |
| 2003/0080386 A1 | 5/2003 | Ker et al. | |
| 2003/0080388 A1 | 5/2003 | Disney et al. | |
| 2003/0089901 A1 * | 5/2003 | Fitzgerald | 257/19 |
| 2003/0098479 A1 * | 5/2003 | Murthy et al. | 257/288 |
| 2003/0136985 A1 * | 7/2003 | Murthy et al. | 257/288 |
| 2003/0183880 A1 | 10/2003 | Goto et al. | |
| 2004/0007715 A1 | 1/2004 | Webb et al. | |
| 2004/0016972 A1 | 1/2004 | Singh et al. | |
| 2004/0026765 A1 | 2/2004 | Currie et al. | |
| 2004/0031979 A1 | 2/2004 | Lochtefeld et al. | |
| 2004/0061178 A1 | 4/2004 | Lin et al. | |
| 2004/0070035 A1 * | 4/2004 | Murthy et al. | 257/408 |
| 2004/0075122 A1 | 4/2004 | Lin et al. | |
| 2004/0087098 A1 | 5/2004 | Ng et al. | |
| 2004/0114422 A1 | 6/2004 | Yabe | |
| 2004/0140506 A1 | 7/2004 | Singh et al. | |
| 2004/0173815 A1 | 9/2004 | Yeo et al. | |

| | | | |
|---|---|---|---|
| 2004/0179391 A1 | 9/2004 | Bhattacharyya | |
| 2004/0195633 A1 | 10/2004 | Chakravarthi et al. | |
| 2004/0217448 A1* | 11/2004 | Kumagai et al. | 257/627 |
| 2004/0232513 A1* | 11/2004 | Chi et al. | 257/510 |
| 2004/0262683 A1 | 12/2004 | Bohr et al. | |
| 2004/0266116 A1 | 12/2004 | Mears et al. | |
| 2005/0029601 A1 | 2/2005 | Chen et al. | |
| 2005/0121727 A1 | 6/2005 | Ishitsuka et al. | |
| 2005/0224986 A1 | 10/2005 | Tseng et al. | |
| 2005/0224988 A1 | 10/2005 | Tuominen | |
| 2005/0236694 A1 | 10/2005 | Wu et al. | |
| 2006/0001073 A1 | 1/2006 | Chen et al. | |

OTHER PUBLICATIONS

Cavassilas, N., et al., "Capacitance-Voltage Characteristics of Metal-Oxide-Strained Semiconductor Si/SiGe Heterostructures," Nanotech 2002, vol. 1, pp. 600-603.

Chang, L., et al., "Direct-Tunneling Gate Leakage Current in Double-Gate and Ultrathin Body MOSFETs," 2002 IEEE Transactions on Electron Devices, vol. 49, No. 12, Dec. 2002, pp. 2288-2295.

Chang, L., et al., "Reduction of Direct-Tunneling Gate Leakage Current in Double-Gate and Ultra-Thin Body MOSFETs," IEEE, 2001, pp. 4 pages.

Gámiz, F., et al., "Electron Transport in Strained Si Inversion Layers Grown on SiGe-on-Insulator Substrates," Journal of Applied Physics, vol. 92, No. 1, Jul. 1, 2002, pp. 288-295.

Gámiz, F., et al., "Strained-Si/SiGe-on-Insulator Inversion Layers: The Role of Strained-Si Layer Thickness on Electron Mobility," Applied Physics Letter, vol. 80, No. 22, Jun. 3, 2002, pp. 4160-4162.

Huang, X., et al., "Sub-50 nm P-Channel FinFET," IEEE Transactions on Electron Devices, vol. 48, No. 5, May 2001, pp. 880-886.

Ismail, K, et al., "Electron Transport Properties of Si/SiGe Heterostructures: Measurements and Device Implications," Applied Physics Letter, vol. 63, No. 5, Aug. 2, 1993, pp. 660-662.

Jurczak, M., "Silicon-on-Nothing (SON)—an Innovative Process for Advanced CMOS," IEEE Transactions on Electron Devices, vol. 47, No. 11, Nov. 2000, pp. 2179-2187.

Jurczak, M., et al., "SON (Silicon on Nothing)—A New Device Architecture for the ULSI Era," Symposium on VLSI Technology Digest of Technical Papers, 1999, pp. 29-30.

Leitz, C.W. et al., "Channel Engineering of SiGe-Based Heterostructures for High Mobility MOSFETs," Materials Research Society Symposium Proceedings, vol. 686, 2002, pp. 113-118.

Leitz, C.W., et al., "Hole Mobility Enhancements in Strained $Si/Si_{1-y}Ge_y$ P-Type Metal-Oxide-Semiconductor Field-Effect Transistors Grown on Relaxed $Si_{1-x}Ge_x$ (x<y) Virtual Substrates," Applied Physics Letters, vol. 79, No. 25, Dec. 17, 2001, pp. 4246-4248.

Liu, K.C., et al., "A Novel Sidewall Strained-Si Channel nMOSFET," IEDM, 1999, pp. 63-66.

Maiti, C.K., et al, "Film Growth and Material Parameters," Application of Silicon-Germanium Heterostructure, Institute of Physics Publishing, Ch. 2.

Matthews, J.W., "Defects Associated with the Accommodation of Misfit Between Crystals," J. Vac. Sci. Technol., vol. 12, No. 1, Jan./Feb. 1975, pp. 126-133.

Matthews, J.W., et al., "Defects in Epitaxial Multilayers—I. Misfit Dislocations," Journal of Crystal Growth, vol. 27, 1974, pp. 118-125.

Matthews, J.W., et al., "Defects in Epitaxial Multilayers—II. Dislocation Pile-Ups, Threading Dislocations, Slip Lines and Cracks", Journal of Crystal Growth, vol. 29, 1975, pp. 273-280.

Matthews, J.W., et al., "Defects in Epitaxial Multilayers—III. Preparation of Almost Perfect Multilayers," Journal of Crystal Growth, vol. 32, 1976, pp. 265-273.

Mizuno, T., et al., "Novel SOI p-Channel MOSFETs With Higher Strain in Si Channel Using Double SiGe Heterostructures," IEEE Transactions on Electron Devices, vol. 49, No. 1, Jan. 2002, pp. 7-14.

Nayak, D.K., et al., "Enhancement-Mode Quantum-Well $Ge_xSi_{1-x}$ PMOS," IEEE Electron Device Letters, vol. 12, No. 4, Apr. 1991, pp. 154-156.

Ootsuka, F., et al., "A Highly Dense, High-Performance 130nm Node CMOS Technology for Large Scale System-on-a-Chip Application," International Electron Device Meeting, 2000, pp. 575-578.

Schüppen, A., et al., "Mesa and Planar SiGe-HBTs on MBE-Wafers," Journal of Materials Science: Materials in Electronics, vol. 6, 1995, pp. 298-305.

Shahidi, G.G., "SOI Technology for the GHz Era," IBM J. Res. & Dev., vol. 46, No. 2/3, Mar./May 2002, pp. 121-131.

Shimizu, A., et al., "Local Mechanical-Stress Control (LMC): A New Technique for CMOS-Performance Enhancement," IEDM 2001, pp. 433-436.

Tezuka, T., et al., "High-Performance Strained Si-on-Insulator MOSFETs by Novel Fabrication Processes Utilizing Ge-Condensation Technique," Symposium on VLSI Technology Digest of Technical Papers, 2002, pp. 96-97.

Thompson, S., et al., "A 90 nm Logic Technology Featuring 50nm Strained Silicon Channel Transistors, 7 Layers of Cu Interconnects, Low k ILD, and 1 $um^2$ SRAM Cell," IEDM, Dec. 2002, pp. 61-64.

Tiwari, S., et al. "Hole Mobility Improvement in Silicon-on-Insulator and Bulk Silicon Transistors Using Local Strain," International Electron Device Meeting, 1997, pp. 939-941.

Wang, L.K., et al., "On-Chip Decoupling Capacitor Design to Reduce Switching-Noise-Induced Instability in CMOS/SOI VLSI," Proceedings of the 1995 IEEE International SOI Conference, Oct. 1995, pp. 100-101.

Welser, J., et al., "NMOS and PMOS Transistors Fabricated in Strained Silicon/Relaxed Silicon-Germanium Structures," IEDM, 1992, pp. 1000-1002.

Wong, H.-S.P., "Beyond the Conventional Transistor," IBM J. Res. & Dev., vol. 46, No. 2/3, Mar./May 2002, pp. 133-167.

Yang, F.L., et al, "35nm CMOS FinFETs," Symposium on VLSI Technology Digest of Technical Papers, 2002, pp. 104-105.

Yang, F.L., et al., "25 nm CMOS Omega FETs," IEDM, 2002, pp. 255-258.

Yeoh, J.C., et al., "MOS Gated Si:SiGe Quantum Wells Formed by Anodic Oxidation," Semicond. Sci. Technol., vol. 13, 1998, pp. 1442-1445.

Wolf, S., et al., "Silicon Processing For The VLSI Era," vol. 1: Process Technology, Second Edition, Lattice Press, Sunset Beach, California, 2000, pp. 834-835.

Wolf, S., "Silicon Processing For The VLSI Era," vol. 2: Process Integration, Lattice Press, Sunset Beach, California, 1990, pp. 144-145.

Wolf, Stanley, Ph.D., et al., "Silicon Processing for the VLSI Era," vol. 1: Process Technology, Second Edition, Lattice Press, Sunset Beach, CA, 2000, pp. 374-385.

Wolf, Stanley, Ph.D., "Silicon Processing for the VLSI Era, " vol. 2: Process Integration, Lattice Press, Sunset Beach, CA, 1990, pp. 658-663.

Celik, M., et al., "A 45nm Gate Length High Performance SOI Transistor for 100nm CMOS Technology Applications," Symposium on VLSI Technology, Digest of Technical Papers, 2002, pp. 166-167, IEEE.

Chau, R., et al., "A 50 nm Depleted-Substrate CMOS Transistor (DST)," International Electron Device Meeting, IEDM Technical Digest, Dec. 2001, pp. 29.1.1-29.1.4, Washington, DC.

Chen, W., et al., "Suppression of the SOI Floating-body Effects by Linked-body Device Structure," Symposium on VLSI Technology, Digest of Technical Papers, Jun. 11-13, 1996, pp. 92-93, Honolulu, HI.

Fung, S.K.H. et al., "Gate length scaling accelerated to 30nm regime using ultra-thin Film PD-SOI technology," International Electron Device Meeting, IEDM Technical Digest, Dec. 2-5, 2001, pp. 629-632, Washington, DC.

Geppert, L., "The Amazing Vanishing Transistor Act," IEEE Spectrum, Oct. 1, 2002, pp. 28-33, vol. 39, No. 10, IEEE.

Kuang, J.B., et al., "SRAM Bitline Circuits on PD SOI: Advantages and Concerns," IEEE Journal of Solid-State Circuits, Jun. 1997, pp. 837-844, vol. 32, No. 6, IEEE.

Yang, F.-L., "Strained FIP-SOI (FinFET/FD/PD-SOI) for Sub-65 nm CMOS Scaling," Symposium on VLSI Technology, Digest of Technical Papers, Jun. 10-12, 2003, pp. 137-138.

* cited by examiner

STRAINED CHANNEL TRANSISTOR FORMATION

This application claims the benefit of U.S. Provisional Application No. 60/490,425 filed on Jul. 25, 2003, entitled Strained-Channel Transistor With Lattice-Mismatched Region, which application is hereby incorporated herein by reference.

TECHNICAL FIELD

The present invention relates generally to semiconductor devices and, more particularly, to a system and method for strained channel transistor formation.

BACKGROUND

As device sizes and power requirements decrease, attempts are being made to improve the electron mobility in the channel region of metal-oxide semiconductor field-effect transistors (MOSFETs). One such attempt includes inducing strain in the channel region. It has been found that a strained channel region improves carrier mobility within the channel region. The magnitude of strain directly affects the amount of improvement or degradation to the carrier mobility and transistor performance.

An ideal strained channel transistor 10 is shown in FIG. 1a. The strained channel transistor 10 includes a gate structure 11 having a gate dielectric 14 underlying a gate electrode 16. The gate structure 11 also includes spacers 18 formed along the sidewalls of the gate electrode 16 and the gate dielectric 14. A material having a different lattice constant is formed in recessed regions 20. Because the material in the recessed regions 20 have a different lattice constant, a lattice mismatch occurs and induces a strain in the region of the substrate positioned between the recessed regions 20, e.g., the channel region. Ion implants may be performed to form lightly-doped drains 24 and heavily-doped source/drain regions 22.

Attempts have also varied the position of the recessed regions 20. For example, the recessed regions 20 may be formed in the LDD 24 and the heavily-doped source/drain regions 22 as illustrated in FIG. 1a. Other attempts form the recessed regions 20 in the heavily-doped source/drain regions 22 as illustrated in FIG. 1b. Yet other attempts (not shown) may utilize dummy spacers to position the recessed regions under a portion of the spacers 18.

Strained channel manufacturing techniques, however, frequently comprise steps that may damage the gate structure 11, contributing to degraded transistor performance. For example, the recessed regions 20 are typically formed by a silicon etching step performed after the gate dielectric 14 and the gate electrode 16 have been formed. After the silicon etching step is performed, a material having a lattice mismatch with the underlying substrate is grown. Silicon germanium is frequently used to form the recessed regions when a silicon substrate is used. Exposing the gate structure 11 to the silicon etching steps may damage the gate structure 11 and adversely affect the performance of the transistor.

Furthermore, some attempts, such as that illustrated in FIG. 1b, perform the silicon etching steps after the formation of the spacers 18. In these attempts, the silicon etching process may also erode the spacers 18, as illustrated by the spacers being etched below the top of the gate electrode 16 in FIG. 1b. The eroded thickness and height of spacers 18 after the silicon etch back step provide less protection and isolation to the gate structure 11 and may expose the gate electrode 16 to cracks 25 (FIG. 1b) in an overlying dielectric layer (not shown), such as an etch stop layer or an inter-level dielectric layer, possibly leading to short-circuiting and transistor malfunction.

Furthermore, the gate structure 11 may also be exposed to a hydrofluoric acid or other cleaning solutions applied during a pre-cleaning process performed before depositing the lattice mismatch material. The pre-cleaning process may result in spacer voids 28, shown in FIG. 1b, wherein the oxide liner 32 below the spacers 18 is partially etched. The spacer voids may cause silicide formation under the spacers and may cause the spacer to peel.

Another issue may arise as a result of a wafer pre-bake step that is commonly performed before SiGe deposition. The pre-bake step may include heating the wafer to 850° C. or more for five minutes or more before the lattice mismatch material is deposited. This pre-bake step lowers the thermal budget available for LDD implant annealing, source/drain implant annealing, and other manufacturing steps requiring high temperatures, thereby unnecessarily imposing restrictions on other processing steps.

FIG. 1b also illustrates a mushroom-like shape 30 that may be formed over the gate structure 11. The mushroom-like shape 30 is a common and undesired result of exposing the gate structure 11 to the SiGe deposition step. The mushroom-like shape 30 may adversely affect the characteristics of the transistor.

SUMMARY OF THE INVENTION

These and other problems are generally solved or circumvented, and technical advantages are generally achieved, by preferred illustrative embodiments of the present invention which provide a strained-channel transistor with lattice-mismatched region.

In accordance with an embodiment of the present invention, a strained channel transistor formed on a substrate comprising a first material is provided. A source region and a drain region are formed by creating recessed regions in the substrate prior to forming the gate electrode of the transistor. A stress-inducing material is formed in the recessed regions. A cap layer may be formed over the stress-inducing material, and a silicide region may be formed in the source and drain regions.

In accordance with another embodiment of the present invention, a method of forming a strained channel device is provided. Masking layers are formed and patterned on a substrate to define source and drain regions. Recessed areas are then formed in the substrate, and a stress-inducing material is formed source and drain regions. A cap layer may be formed over the stress-inducing material. A gate electrode and spacers may then be formed. The source and drain regions may be silicided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred illustrative embodiments are discussed in detail below. It should be appreciated, however, that the present invention provides many applicable inventive concepts that can be embodied in a wide variety of specific contexts. The specific illustrative embodiments discussed are merely illustrative of specific ways to make and use the invention, and do not limit the scope of the invention.

The present invention relates to the field of semiconductor devices and, more specifically, to the manufacture of strained channel field effect transistors with lattice-mismatched regions. A method of manufacturing in accordance with a first illustrative embodiment of the present invention is described below.

Figure 1A:
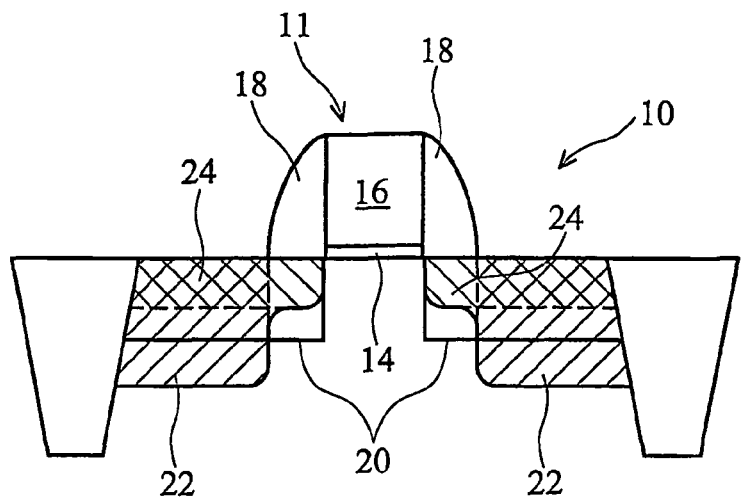
FIG. 1a is a cross-sectional view of a strained channel transistor known in the art.
Figure 1B:
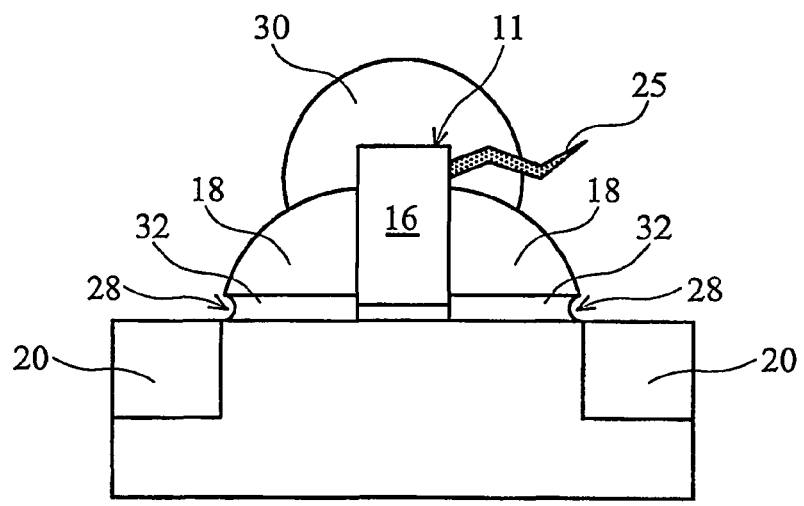
FIG. 1b shows gate structure degradation suffered during strained channel formation steps.
Figure 2A:
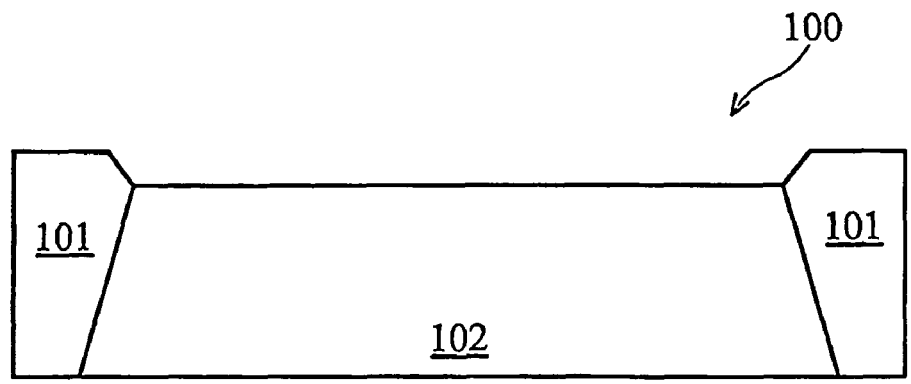
FIGS. 2a-2h show a method of forming a strained channel transistor in accordance with a first illustrative embodiment of the present invention.

FIG. 2a shows a substrate 100 having an active area 102 defined by shallow trench isolation structures 101. Alternatively, other types of isolation structures, such as LOCOS and mesa isolation structures, may isolate the active area 102. The substrate 100 may comprise any semiconductor material and may comprise known structures including a graded layer or a buried oxide, for example. In an embodiment, the substrate 100 comprises bulk silicon that may be undoped or doped (e.g., p-type, n-type, or a combination thereof). Other materials that are suitable for strained channel transistor formation may be used.

Figure 2B:
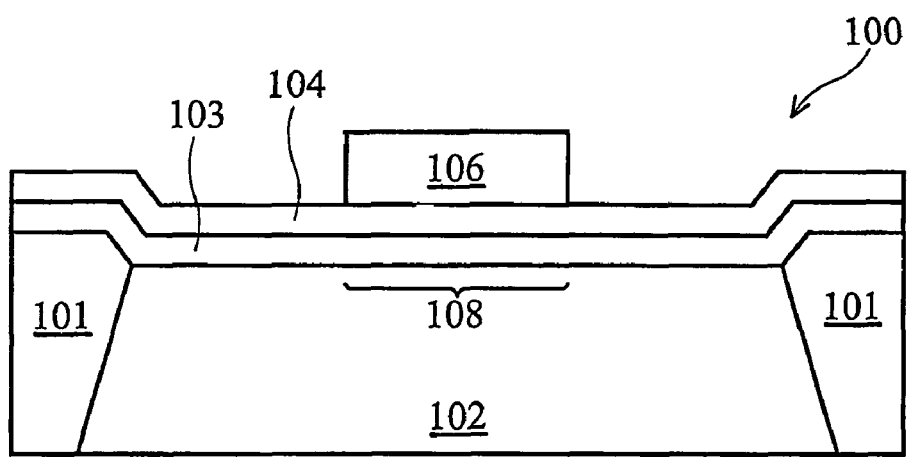

FIG. 2b shows the substrate 100 after a first dielectric layer 103, a second dielectric layer 104, and a photoresist mask 106 have been formed thereon. The first dielectric layer 103 may be, for example, a dielectric antireflective coating (DARC), and the second dielectric layer 104 may be, for example, a bottom antireflective coating material (BARC). A photoresist mask 106 may be formed by depositing and patterning a photoresist material in accordance with standard photolithography techniques. In the embodiment illustrated in FIG. 2b, the photoresist mask 106 is patterned over a portion of the active area 102 that is to become a strained portion 108 of the substrate 100.

Figure 2C:
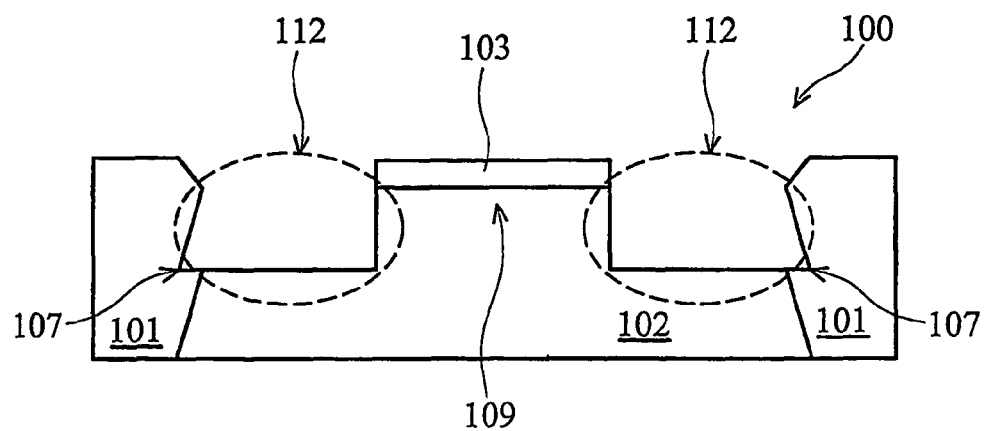

Referring now to FIG. 2c, the substrate 100 of FIG. 2b is shown after etching steps have been performed to remove exposed portions of the first dielectric layer 103 and the second dielectric layer 104 and to etch back the substrate, thereby forming recessed areas 112. Positioned between the recessed areas 112 is a channel region 109. A plasma ashing step, for example, may be used to remove the remaining photoresist mask 106 and the second dielectric layer 104. In an embodiment, the depth of the recessed areas 112 is about 150 Å to about 2,000 Å.

It is preferred that a pre-cleaning process step be performed after performing the substrate etch back process described above. The pre-cleaning process may be performed with a wet dip in a solution of hydrofluoric acid. It should be noted, however, that performing this pre-cleaning process may cause a step feature 107 to be formed along the side of the STIs 101. This may be caused because the cleaning solution may remove a portion of the STIs 101.

Figure 2D:
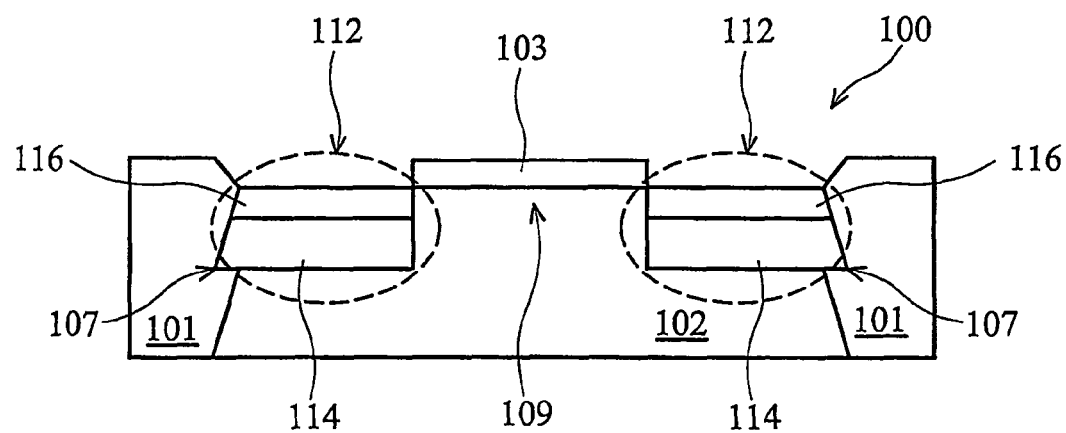

FIG. 2d shows the epitaxial growth of a stress-inducing layer 114, such as silicon germanium, followed by the growth of semiconductor layer 116 in the recessed areas 112. The semiconductor layer 116 may be formed of silicon, for example. Although the channel region 109 preferably comprises silicon and the recessed areas 112 preferably comprise silicon germanium, the channel region 109 and the recessed areas 112 may comprise any material combination that provides any type of strain (e.g., compressive, tensile, uniaxial, or biaxial) in the channel region 109 suitable for a particular application. For example, in an embodiment the recessed areas 112 may comprise silicon carbon or silicon germanium carbon and the channel region 109 may comprise silicon. Furthermore, the mismatched recess areas 112 may have any shape, including being directly adjacent the channel region 109, being separated from the adjacent STI 101, and being in the deep source/drain regions or in the lightly doped drain regions, for example. In an embodiment, the stress-inducing layer 114 is about 150 Å to about 2,200 Å in thickness, and the channel region is about 20 nm to about 150 nm.

Figure 2E:
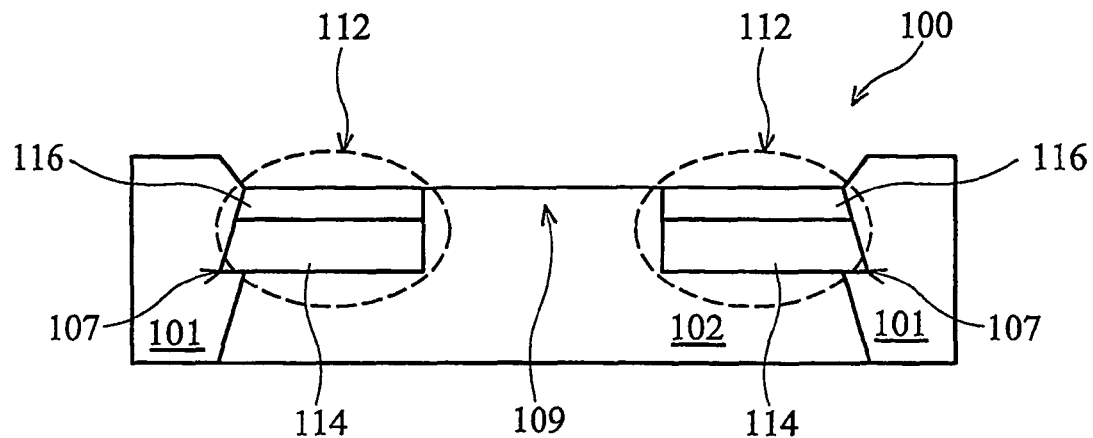
Figure 2F:
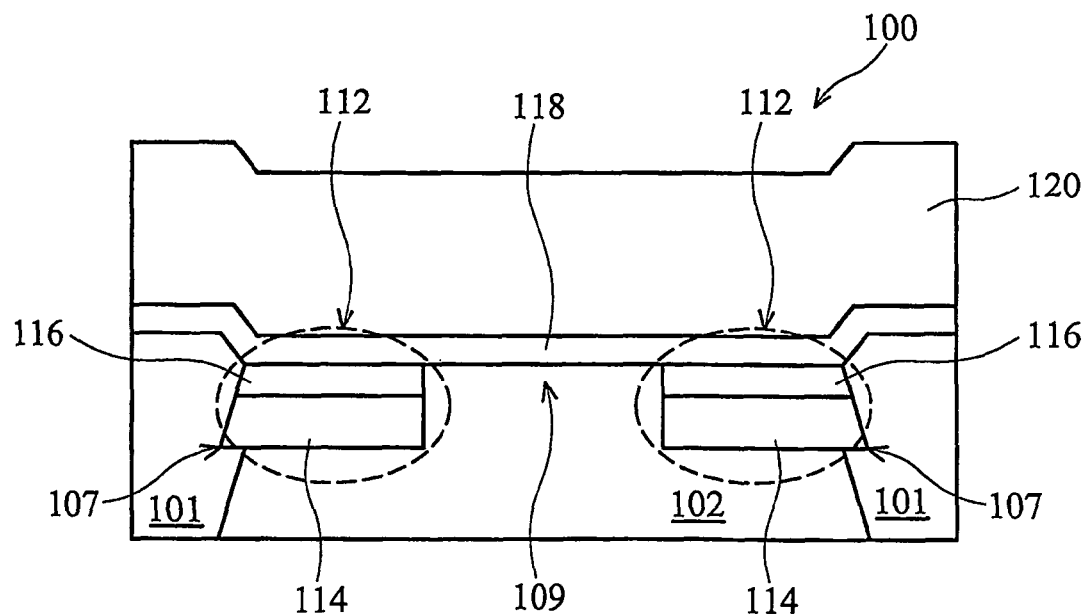

In FIG. 2e, the remaining portions of the first dielectric layer 103 (FIG. 2d) are removed and in FIG. 2f, a dielectric layer 118 and a conductive layer 120 are formed. The dielectric layer 118, which will be patterned to form a gate dielectric layer in a subsequent step, is preferably an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, however, the dielectric layer 118 is silicon dioxide material formed by an oxidation process. Other materials suitable for strained channel transistor operation may be used. For example, high-k materials such as hafnium oxide, zirconium oxide, or the like may be used.

The conductive layer 120, which will be patterned to form a gate electrode in subsequent steps, preferably comprises a semiconductor material such as polysilicon, amorphous silicon, or the like. The conductive layer 120 may be deposited doped or undoped. For example, in an embodiment the conductive layer 120 comprises polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the conductive layer 120 may comprise a polysilicon metal alloy or a metal gate comprising metals such as tungsten, nickel, and titanium, for example. Additionally, the dielectric layer 118 and the conductive layer 120 may each comprise a single layer or a plurality of layers.

Figure 2G:
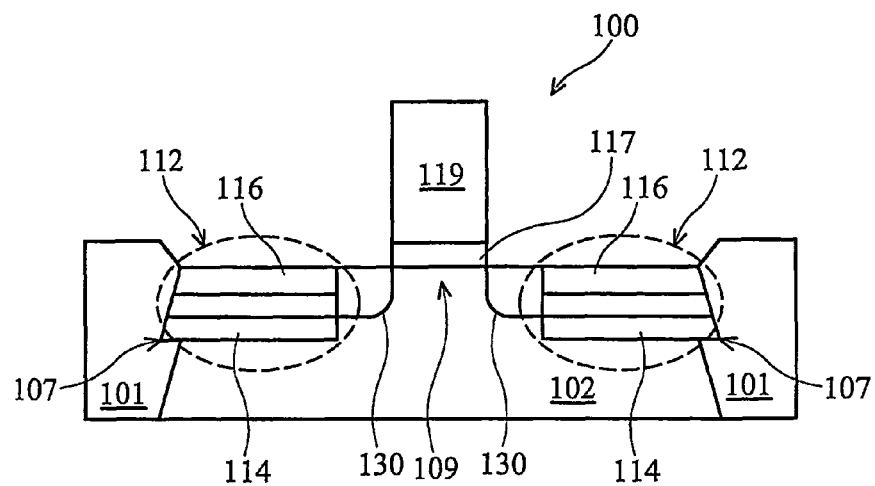

Referring to FIG. 2g, a gate electrode 119 and a gate dielectric layer 117 are patterned over the channel region 109 from the conductive layer 120 (FIG. 2f) and the dielectric layer 118 (FIG. 2f), respectively. The dielectric layer 118 and the conductive layer 120 may be patterned by depositing and patterning a photoresist material in accordance with photolithography techniques. A lightly doped drain (LDD) 130 may be formed along the top portion of the substrate 102 by performing an ion implant step and a subsequent anneal.

It should be noted that the use of a separate mask to form the recessed regions 112 (FIG. 2f) and the gate electrode 119 allows the location and size of the recessed regions 112 and the gate electrode 119 to be independently controlled without the use of dummy spacers.

Figure 2H:
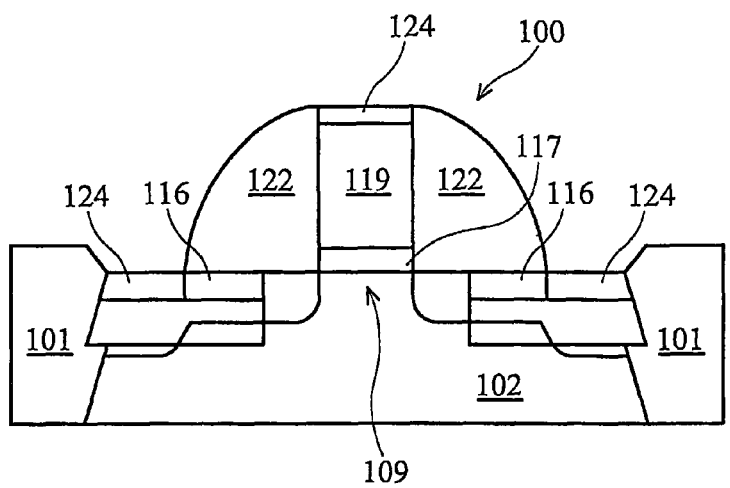

FIG. 2h illustrates the substrate 100 after spacers 122 have been formed alongside the gate electrode 119. The spacers 122 may be formed by depositing a substantially uniform layer of a dielectric material and performing an anisotropic etch procedure. The spacers 122 may be formed of silicon nitride, silicon oxynitride, TEOS, or the like.

Heavily doped source/drain regions 152 may be formed by performing an ion implant in which the spacers 122 and the gate electrode 119 act as masks. An annealing process may be performed after the ion implant. It should be noted that the depth of the source/drain regions 152 and the LDDs 130 may vary relative to the recessed regions 112 and that the illustrated depth of the source/drain regions 152 and the LDDs 130 is only provided as one example of an embodiment of the present invention.

Optionally, a top portion of the substrate 100 in the source/drain regions and the top portion of the gate electrode may be silicided to create silicide regions 124 in the source/drain regions 152 and the gate electrode 119. The silicide regions 124 may be performed by forming a thin layer of metal, such as titanium or the like, over the wafer. A thermal process, such as an anneal, a rapid thermal process, or the like, causes the metal to react with the exposed silicon, e.g., the exposed silicon of semiconductor layer 116 and the exposed polysilicon of the gate electrode 119, thereby forming silicide regions 124. Thereafter, the unreacted metal may be removed.

Significant advantages may be achieved by embodiments of the present invention. For example, embodiments of the present invention may be easily and cost effectively incorporated into current semiconductor fabrication processes. Generally, the integrity of the gate structures of the strained channel devices is preserved. Specifically, gate structure damage such as mushroom-like gate head formation, spacer erosion, spacer cracking, and spacer void formation may be prevented or reduced.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular illustrative embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding illustrative embodiments described herein may be utilized according to the present invention. Accordingly, the appended claims are intended to include within their scope such processes, machines, manufacture, compositions of matter, means, methods, or steps.

What is claimed is:

1. A method of forming a strained channel device, the method comprising:
   patterning a mask on a substrate to define recess regions and a channel region;
   etching back portions of the substrate defined as the recess regions;
   forming a stress-inducing material in the recess regions; and
   subsequently forming a gate dielectric and a gate electrode over the channel region and forming source/drain regions on opposing sides of the gate electrode, the source/drain regions being at least partially located in the stress-inducing material.

2. The method of claim 1, wherein the patterning comprises the steps of:
   forming a first masking layer over an active area of the substrate;
   forming a second masking layer over the first masking layer;
   forming a third masking layer over the second masking layer; and
   patterning the third masking layer to define the recess regions and the channel region.

3. The method of claim 2, wherein the first masking layer comprises a dielectric antireflective coating (DARC).

4. The method of claim 2, wherein the second masking layer comprises a bottom antireflective coating (BARC).

5. The method of claim 2, wherein the third masking layer comprises a photoresist.

6. The method of claim 2, wherein the third masking layer and the second masking layer are substantially removed during the etching step.

7. The method of claim 6, further comprising removing remaining portions of the first masking layer after the etching step.

8. The method of claim 1, further comprising epitaxially growing silicon over the stress-inducing material, and wherein the forming source/drain regions comprises:
   performing a lightly doped drain implant and anneal, wherein the gate dielectric and the gate electrode act as a mask for the implant;
   forming spacers alongside the gate dielectric and the gate electrode;
   performing source/drain implant and anneal, wherein the gate dielectric, gate electrode, and spacers act as a mask; and
   forming silicide in the source, drain and gate electrode.

9. A method of forming a strained channel device, the method comprising:
   patterning a mask on a substrate to define recess regions and a channel region;
   etching back portions of the substrate defined as the recess regions;
   forming a stress-inducing material in the recess regions;
   subsequently forming a gate over the channel region and source/drain regions in the stress-inducing material; and
   pre-cleaning the recess regions prior to forming the stress-inducing material.

10. The method of claim 9, wherein the patterning comprises the steps of:
    forming a first masking layer over an active area of the substrate;
    forming a second masking layer over the first masking layer;
    forming a third masking layer over the second masking layer; and
    patterning the third masking layer to define the recess regions and the channel region.

11. The method of claim 10, wherein the first masking layer comprises a dielectric antireflective coating (DARC).

12. The method of claim 10, wherein the second masking layer comprises a bottom antireflective coating (BARC).

13. The method of claim 10, wherein the third masking layer comprises a photoresist.

14. The method of claim 10, wherein the third masking layer and the second masking layer are substantially removed during the etching step.

15. The method of claim 14, further comprising removing remaining portions of the first masking layer after the etching step.

16. The method of claim 9, further comprising epitaxially growing silicon over the stress-inducing material, and the forming source/drain regions comprises:
    forming a gate dielectric and a gate electrode over the channel region;
    performing a lightly doped drain implant and anneal, wherein the gate dielectric and the gate electrode act as a mask for the implant;

forming spacers alongside the gate dielectric and the gate electrode;

performing source/drain implant and anneal, wherein the gate dielectric, gate electrode, and spacers act as a mask; and forming silicide in the source, drain and gate electrode.

17. A method of manufacturing a strained channel transistor comprising:

forming a source recess and a drain recess in a substrate, the source and drain recesses defining a channel region therebetween;

at least partially filling the source recess and the drain recess with a first material, the first material causing a strain upon a lattice structure of the channel region; and subsequently forming a gate electrode over the channel region, the gate electrode having a gate dielectric layer and a conductive layer.

18. The method of claim 17, wherein the step of at least partially filling the source recess and the drain recess with a first material does not completely fill the source recess and the drain recess, and further comprising forming a cap layer over the first material in the source recess and the drain recess with a second material.

19. The method of claim 18, wherein the substrate and the second material are the same material.

20. The method of claim 18, further comprising siliciding a portion of the cap layer.

21. The method of claim 17, further comprising forming gate spacers along sidewalls of the gate electrode, the gate spacers overlying and covering a portion of the first material filling the drain recess and the source recess and leaving a portion of the first material filling the drain recess and the source recess exposed.

* * * * *